US006614123B2

(12) United States Patent
Lee et al.

(10) Patent No.: US 6,614,123 B2
(45) Date of Patent: Sep. 2, 2003

(54) PLASTIC BALL GRID ARRAY PACKAGE WITH INTEGRAL HEATSINK

(75) Inventors: Taekeun Lee, Ichon-si (KR); Flynn Carson, Redwood City, CA (US); Marcos Karnezos, Palo Alto, CA (US)

(73) Assignee: ChipPAC, Inc., Fremont, CA (US)

( * ) Notice: Subject to any disclaimer, the term of this patent is extended or adjusted under 35 U.S.C. 154(b) by 0 days.

(21) Appl. No.: 09/919,763

(22) Filed: Jul. 31, 2001

(65) Prior Publication Data

US 2003/0025215 A1 Feb. 6, 2003

(51) Int. Cl.[7] ............................. H01L 23/28; H01L 23/29
(52) U.S. Cl. ....................... 257/796; 257/783; 257/787; 257/791
(58) Field of Search ........................... 257/796, 787, 257/693, 783, 793, 678, 791; 438/124, 126, 127; 361/709

(56) References Cited

U.S. PATENT DOCUMENTS

| | | | |
|---|---|---|---|
| 5,365,107 A | * 11/1994 | Kuraishi et al. | ............ 257/673 |
| 5,397,921 A | 3/1995 | Karnezos | |
| 5,409,865 A | 4/1995 | Karnezos | |
| 5,851,337 A | 12/1998 | Chen | |
| 5,877,552 A | 3/1999 | Chiang | |
| 5,905,634 A | 5/1999 | Takeda et al. | |
| 5,933,324 A | 8/1999 | Barrett | |
| 5,977,626 A | * 11/1999 | Wang et al. | ................ 257/707 |
| 6,020,637 A | 2/2000 | Karnezos | |
| 6,146,921 A | 11/2000 | Barrow | |
| 6,201,302 B1 | * 3/2001 | Tzu | ............................. 257/724 |
| 6,246,115 B1 | * 6/2001 | Tang et al. | .................. 257/706 |
| 6,323,065 B1 | 11/2001 | Karnezos | |
| 6,400,014 B1 | 6/2002 | Huang et al. | |

OTHER PUBLICATIONS

Tetsuo Kida, Takashi Haruta, and Takashi Yoshioka, "Improving Dry–Film Adhesion," Optoelectronics Manufacturing Conference, Jul. 2001.

* cited by examiner

*Primary Examiner*—Jasmine Clark
(74) *Attorney, Agent, or Firm*—Bill Kennedy; Haynes Beffel & Wolfeld LLP

(57) ABSTRACT

A plastic ball grid array semiconductor package employs a metal heat spreader having supporting arms embedded in the molding cap, in which the embedded supporting arms are not directly affixed to the substrate or in which any supporting arm that is affixed to the substrate is affixed using a resilient material such as an elastomeric adhesive. Also, a process for forming the package includes steps of placing the heat spreader in a mold cavity, placing the substrate over the mold cavity such that the die support surface of the substrate contacts the supporting arms of the heat spreader, and injecting the molding material into the cavity to form the molding cap. The substrate is positioned in register over the mold cavity such that as the molding material hardens to form the mold cap the embedded heat spreader becomes fixed in the appropriate position in relation to the substrate. Also, a process for forming the package includes steps of placing the heat spreader onto the substrate such that at least one of the supporting arms of the heat spreader is affixed to the substrate using a resilient fixative such as an elastomeric adhesive, placing a mold cavity over the heat spreader, and injecting the molding material into the cavity. The elastomeric adhesive holds the heat spreader in the appropriate position in relation to the substrate during injection of the molding material, and as the molding material hardens to form the mold cap the embedded heat spreader becomes fixed in the appropriate position in relation to the substrate. In some embodiments the under surface of the heat spreader at the interface between the heat spreader and the molding compound is roughened, or includes a black copper oxide layer, to improve adhesion and contact between the heat spreader and the molding material. The invention can provide significant improvements in manufacturability and reliability in use.

21 Claims, 3 Drawing Sheets

PLASTIC BALL GRID ARRAY PACKAGE WITH INTEGRAL HEATSINK

FIELD OF THE INVENTION

This invention relates to high performance semiconductor device packaging.

Semiconductor devices increasingly require lower cost packaging with higher thermal and electrical performance. A common package used for high performance devices is the Plastic Ball Grid Array ("PBGA"). The PBGA is a surface mount package that can provide higher thermal and electrical performance, and a lower thickness profile and a smaller footprint, as compared to leadframe based surface mount packages such as Plastic Quad Flat Package ("PQFP") and others. Improvements are sought in the structure and design of the package, to provide increased thermal and electrical performance and to maintain the established footprint and thickness characteristics of standard PBGAs.

BACKGROUND OF THE INVENTION

In conventional PBGAs a small fraction of the heat generated by the semiconductor device dissipates to the ambient through the molding compound, principally at the upper surface of the package, and, to a much lesser extent, through the sides. Most of the heat that is generated by the semiconductor device in standard PBGAs is conducted through the solder balls to the product board, and the board acts as a heat sink.

Various approaches have been employed or suggested for increasing power dissipation from PBGAs. For example, power dissipation to the ambient can be increased by blowing air over the package; but cost considerations or space limitations may make such air cooling approaches impractical. And, for example, power dissipation can be increased by increasing the number of solder balls between the package and the board, and, particularly, by increasing the number of balls directly beneath the device; and by using a laminate substrate having multiple metal layers. These approaches require increases in package dimensions and changes in the package structure.

In another approach to increasing power dissipation from PBGAs, often referred to as "Thermally Enhanced PBGA" or TEPBGA, a partially embedded metal heat spreader is employed. The partially embedded metal heat spreader includes an upper generally planar portion having a top surface free of the molding compound and exposed to ambient; and embedded portions, which may be referred to as supporting arms, extending from the upper portion downward to the substrate and attached at the lower ends to the upper or die support surface of the substrate.

Conventionally, TEPBGAs having partially embedded beat spreaders are formed generally as follows. A completed ball grid array is provided, with the die attached on the die support surface of the substrate and connected to the substrate, e.g. by wire bonds. A heat spreader is placed on the support surface of the substrate over the die, with the heat spreader supporting arms rigidly affixed onto the supporting surface using, for example, a cement or adhesive, such as an epoxy cement or adhesive or glue. Then this assembly is placed over a mold cavity in an injection mold, so that the upper surface of the upper portion of the heat sink is at the bottom of the mold cavity and the substrate surface contacts the edges of the upper opening of the mold cavity. Then the molding compound is injected into the cavity, where it encloses the die and the wire bonds and the supporting arms of the heat spreader and fills the space between the upper surface of the die and the upper portion of the heat spreader. The molding material hardens to form the mold cap, and the completed assembly is released from the mold.

SUMMARY

Manufacturing defects can occur in the conventional process for forming a TEPBGA with a partially embedded heat spreader, as a result of stress on the rigid attachment of the supporting arms to the substrate surface. Particularly, apparently, flexing of the supporting arms during processing can result in breakage of the substrate. Moreover, because there is a significant difference in the coefficient of thermal expansion of the material of the heat spreader, which is a metal such as copper, and the coefficient of thermal expansion of the substrate material, stresses develop during temperature cycling when the device is in use, and such stresses can create cracks in the package substrate, leading to package and device failure. We have discovered that such manufacturing defects and stress effects can be avoided by either performing the injection molding process without affixing the supporting arms to the substrate at all, or by employing a resilient material such as an elastomeric adhesive to affix one or more of the supporting arms to the substrate surface prior to injection molding. The resulting package is less subject to thermal cycling-relayed stress and stress damage, because relief is provided between the supporting arms of the heat spreader and the substrate. This is provided according to the invention because there is either no direct attachment at all between the heat spreader support arms and the substrate or, if there is direct attachment of one or more of the support arms to the substrate, it is a resilient joint.

Accordingly, in one general aspect the invention features a method for manufacturing a plastic ball grid array package, by placing a heat spreader having an upper portion and a plurality of support arms into a mold cavity; placing over the mold cavity a ball grid array including a semiconductor die mounted on a support surface of a substrate and connected to the substrate, such that lower ends of the support arms contact the support surface of the substrate peripheral to the die; injecting molding material into the cavity to form the molding cap; and permitting the molding material to harden to form a mold cap.

In another general aspect the invention features a process for forming a TEPBGA with a partially embedded heat spreader, by placing a heat spreader having an upper portion and a plurality of support arms onto the die support surface of a substrate such that at least one of the supporting arms of the heat spreader is affixed to the substrate using a resilient fixative such as an elastomeric adhesive; placing a mold cavity over the heat spreader; injecting the molding material into the cavity; and permitting the molding material to harden to form the mold cap. The resilient fixative holds the heat spreader in the appropriate position in relation to the substrate during injection of the molding material, and as the molding material hardens to form the mold cap the partially embedded heat spreader becomes fixed in the appropriate position in relation to the substrate.

In another general aspect the invention features a plastic ball grid array semiconductor package including a metal heat spreader having supporting arms embedded in the molding cap, in which the embedded supporting arms are free of direct rigid affixation to the substrate; or in which any supporting arm that is affixed to the substrate is affixed using a resilient material such as an elastomeric adhesive.

In some embodiments the heat spreader is constructed of metal and, in particular embodiments, the heat spreader is constructed of copper. In some embodiments the heat spreader has four supporting arms, configured so that their lower ends contact the substrate surface in a generally rectangular, preferably generally square, array. In some embodiments the resilient material has an elastic modulus in the range 0.5 MPa to 100 MPa, preferably in the range 1 MPa to 10 MPa, and in particular embodiments the resilient material has an elastic modulus of 5.5 MPa. In some embodiments the resilient material is an elastomeric adhesive, for example a silicon adhesive such as the adhesive commercially available as Dow Corning 7920.

In some embodiments the elements of the package are selected so that the overall dimensions of the package are within standard specifications (and, particularly, so that the overall package thickness is about the same as or less than that of standard PBGA packages). Particularly, for example, in some embodiments the thicknesses of the die plus die attach epoxy, the wire bond loop height and the wire-to-mold clearance are determined so that the height from the substrate to the top of the package (that is, the sum of the overall mold cap thickness plus the thickness of the heat spreader and the thickness of the heat spreader adhesive) is no more than 1.17 mm. And, for example, in some embodiments the thicknesses of the portions of elements situated between the semiconductor device and the heat spreader—that is, the elements that lie in the critical thermal path—are determined so as to minimize the length of the critical thermal path.

Particularly, for example, in some embodiments at least part of the molding material between the die and the upper portion of the heat spreader is made as thin as is practicable while avoiding contact between the upper surface of the die and the under surface of the heat spreader, and the upper portion of the heat spreader is accordingly thickened by downward protrusion of the lower surface. As a result, there is an increased proportion of metal in the path between the semiconductor device and the upper surface of the package, so that the combined thermal resistance on the critical heat path from the die to overlying ambient is reduced. And, for example, in some embodiments at least some portion of the volume between the die and the upper portion of the heat spreader is occupied by a material having a lower thermal resistivity than the molding material.

In some particularly preferred embodiments a black copper oxide or a chemically roughened copper under surface of the heat spreader is employed in order to enhance the adhesion between the bottom of the heat spreader and the mold compound. The under surface of the heat spreader is treated to provide the black copper oxide layer or chemically roughened surface before injection of the molding material. Where a black oxide is employed, it can be formed by, for example, exposing the copper surface to $NaClO_2$ for a time sufficient to form the layer to a desired thickness, preferably in the range about 3 um to 15 um and in particular embodiments about 7 um thick. Or, where a chemically roughened copper surface is employed, it can be formed by a micro-etching process such as a conventional $H_2SO_4$—$H_2O_2$ process or other chemical process, to provide the desired roughness, preferably in the range 0.5 um to 1.0 um and in particular embodiments about 0.5 um.

The invention can provide excellent power dissipation in a package more reliably manufacturable than conventional packages, and less likely to fail during thermal cycling in use than conventional packages.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the Figs. illustrating embodiments of the invention, elements corresponding to elements shown in other drawings are not all particularly renumbered, although they are all readily identifiable in all the Figs.

Figure 1:
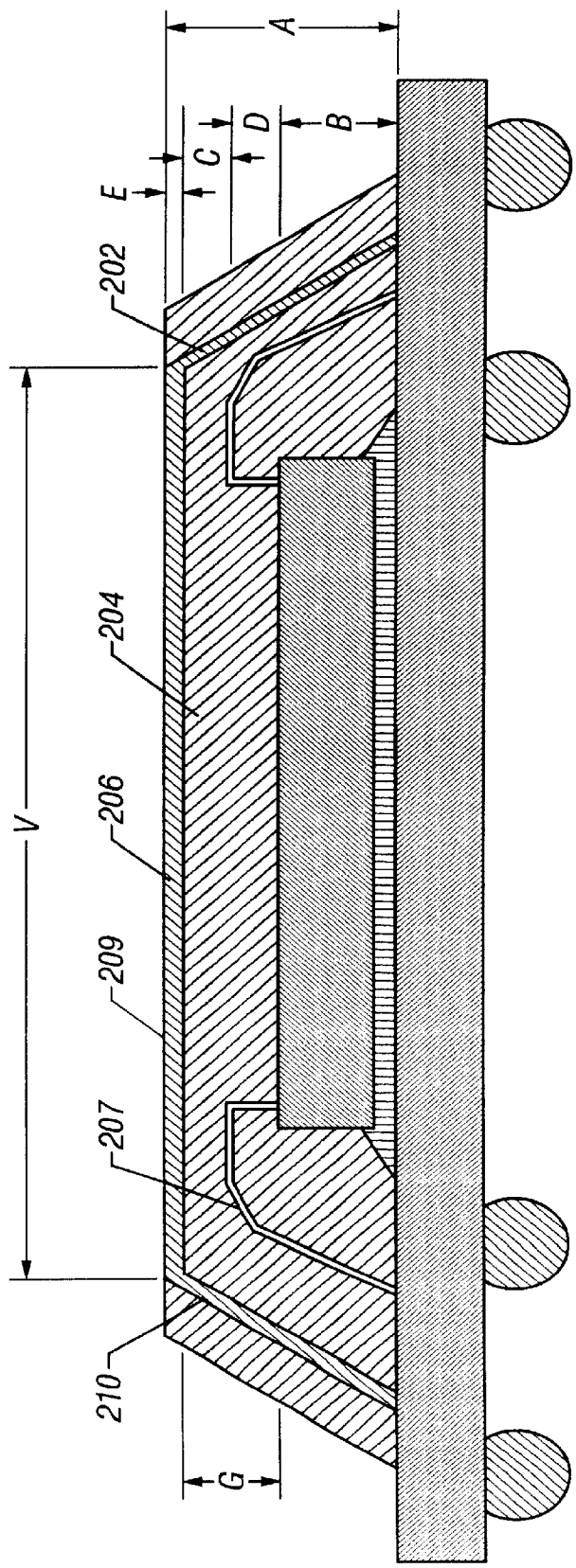
FIG. 1 is a diagrammatic sketch in a transverse sectional view thru a conventional thermally enhanced plastic ball grid array package, having a partially embedded heat spreader with supporting arms rigidly affixed to the substrate.

Turning now to FIG. 1, there is shown in a diagrammatic sectional view a thermally enhanced plastic ball grid array ("TEPBGA") package that is widely used in the industry. This structure makes use of a metal heat spreader 202, partially embedded in the molding cap, with embedded portions attached to the substrate, and having a circular upper portion 206 having an upper surface 209 free of molding compound and exposed to the ambient. Such a construct can provide power dissipation to as much as 3.9 Watts with no airflow, and to as much as 4.2 Watts under airflow of 100 lfpm. The improved heat dissipation is a consequence of increased metal content of the package and contributions from particularly two design factors.

One design factor that contributes to improved thermal performance in the PBGA package of FIG. 1 is the reduction of thermal resistance of the path above the device, that is, between the upper surface of the device and the surface of the package, allowing greater heat flow to the top and to the ambient. The thermal resistance of this path is the sum of the thermal resistance of upper portion 206 of the heat spreader adjacent the upper surface 209, having thickness E, and the thermal resistance of the molding compound 204, having thickness G between the upper surface of the device and the undersurface of the upper portion 206 of the heat spreader. Because the thermal conductivity of the metal of which the heat spreader is formed is typically at least 100 times the thermal conductivity of the molding compound, an increase in the proportion of thickness of the metal decreases thermal resistance and increases heat flow from the device to the top of the package. As a practical matter the maximum thickness E of the upper portion 206 of the heat spreader in this configuration is limited to about 0.30 mm by the mold cap thickness A and by the need to accommodate within the thickness of the mold cap the die and die attach epoxy, which have a combined thickness B, as well as the wire loops 207, which extend a dimension D above the upper surface of the die and which must be kept away from contact with the under surface of the upper portion 206 of the heat spreader, by a clearance dimension C. Some heat is conducted to the top by way of the sidewalls 210 of the heat spreader, but this heat path to the device is longer and less conductive. The following dimensions are typical for commonly used thermally enhanced PBGA packages of the kind shown in FIG. 2: mold cap thickness A, 1.17 mm; die+die attach epoxy thickness B, 0.38 mm; wire bond loop height D, 0.33 mm; heat spreader thickness E, 0.30 mm; wire loop clearance C, 0.16 mm.

Another design factor that contributes to improved thermal performance in the PBGA package of FIG. 1 is the exposed circular heat spreader surface 209 which, with a diameter V in widely-used configurations of 22 mm, which conducts more heat to ambient as compared with a surface of molding compound. Heat conduction is generally proportional to the area of the heat spreader surface 209, but as a practical matter the area is limited usually to about 50% of the upper surface of the mold cap.

According to the invention, improved manufacturability and reduced thermal stress failure is provided by eliminating the use of a rigid attachment of the supporting arms of the heat spreader during manufacture.

Figure 2:
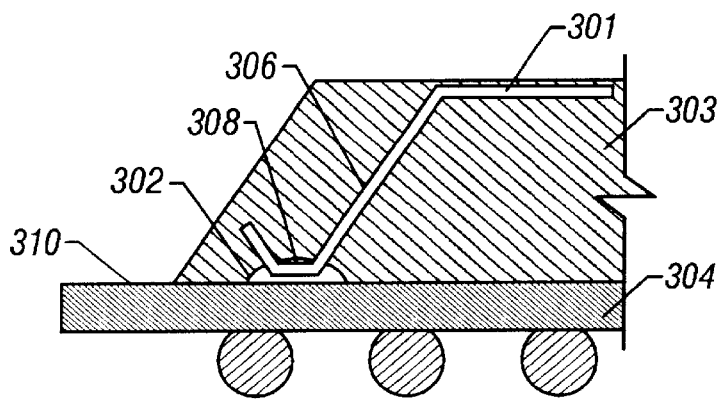
FIG. 2 is a diagrammatic sketch in a transverse sectional view thru a portion of an improved thermally enhanced plastic ball grid array package according to an embodiment of the invention.

FIG. 2 shows a detail of an embodiment according to the invention in which the heat spreader 301 is attached to the substrate 304 by a spot 302 of an elastomeric adhesive on the die support surface 310 of the substrate at the location where at least one of the supporting arms 306 rests. The lower end of the supporting arm may be configured to provide a "foot", as shown for example at 308 in FIG. 2. The use of an elastomer adhesive material minimizes the stress due to the coefficient of thermal expansion difference between material of the heat spreader, which is, for example, copper, and which is embedded in the mold compound 303, and the material of the package substrate 304. This embodiment can be made by applying a spot of the uncured adhesive onto the substrate surface at a location where at least one of the heat spreader supporting arms is to rest, then placing the heat spreader onto the substrate surface over the die, so that the foot 308 of the supporting arm (or arms) 306 contacts the spot of adhesive, and then allowing the adhesive to cure, thereby resiliently fixing the heat spreader in place on the substrate. Or, the spot of adhesive can be placed on a foot 308 of one or more of the supporting arms 306 and then brought into contact with the substrate surface at the appropriate point and allowed to cure.

Figure 3:
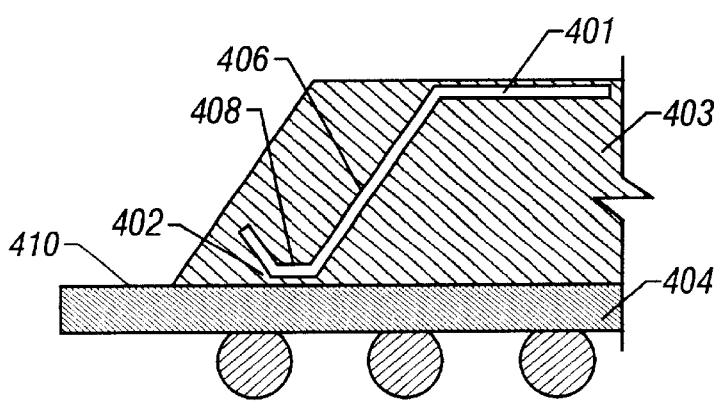
FIG. 3 is a diagrammatic sketch in a transverse sectional view thru a portion of an improved thermally enhanced plastic ball grid array package according to another embodiment of the invention.

FIG. 3 shows a detail of an embodiment of the invention in which the heat spreader 401 is free of direct attachment to the substrate 404. Here, the heat spreader 401 is held in place in the appropriate position on the support surface 410 of the substrate 404 by the embedding mold composition 403, but there is no direct fixative joining the foot 408 of the supporting arm 406 to the substrate surface 410 at the resting place 402. Here, too, thermal cycling stress between the heat spreader and the substrate at the resting place 402 is minimized, because there is no rigid connection there. This can increase the reliability of the package in use.

Figure 4A:
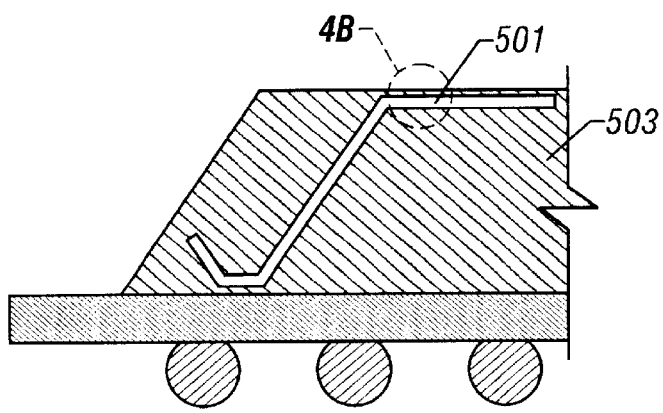
FIG. 4 is a diagrammatic sketch in a transverse sectional view thru an improved thermally enhanced plastic ball grid array package with an enlarged portion showing the under surface of the heat spreader at the interface with underlying material according to an embodiment of the invention.
Figure 4B:
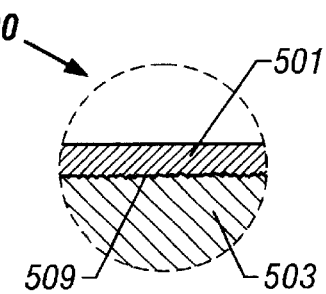

FIG. 4 shows at 500 a detail of the interface 509 between the upper portion of the heat spreader 501 and the underlying mold compound 502. This is a critical area as this is the key thermal path through which heat generated by the device can escape from the top of the die through the mold compound to the heatslug and out of the package top surface. Any gap or delamination at this interface during board mount, or over time in use, can severely impact the thermal performance of the package. Therefore, in some particularly preferred embodiments a black copper oxide or a chemically roughened copper under surface of the heat spreader is employed in order to enhance the adhesion between the bottom of the heat spreader and the mold compound. Where a black oxide is employed, it can be formed by, for example, exposing the copper surface to $NaClO_2$ for a time sufficient to form the layer. In particular embodiments the treatment parameters are designed to produce a black copper oxide layer about 7 um thick; preferably the thickness is in the range 3 um to 15 um. Or, where a chemically roughened copper surface is employed, a micro-etching process can be employed, such as a conventional $H_2SO_4$—$H_2O_2$ process or other chemical process, as described for example in T. Kida et al. "Improving Dry-Film Adhesion", July 2001 Optoelectronics Manufacturing Conference, published on the internet at www.pcfab.com, hereby incorporated herein by reference. In particular embodiments the chemical roughening process parameters are designed to produce a surface roughness about 0.5 um; preferably the roughness is in the range about 0.5 um to 1.0 um.

Figure 5:
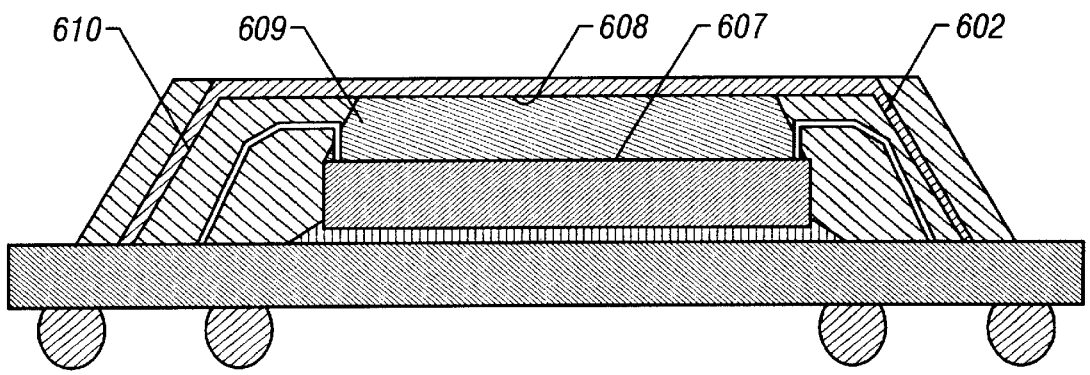
FIG. 5 is a diagrammatic sketch in a transverse sectional view thru an improved thermally enhanced plastic ball grid array package according to still another embodiment of the invention, showing lower thermal resistivity material interposed between the semiconductor device and the overlying portion of the heat spreader.

FIG. 5 shows an alternative embodiment of the package according to the invention in which a thermally conductive material 609 is placed between the top 607 of the die and the bottom 608 of the heat spreader 602, 610. In this embodiment this thermally conductive material 609 is defined having a thermal conductivity greater than that of typical mold compounds (that is, greater than 0.7 W/mK). The material can be a rigid epoxy or, in some embodiments, can be an elastomeric material to provide stress relief.

Figure 6:
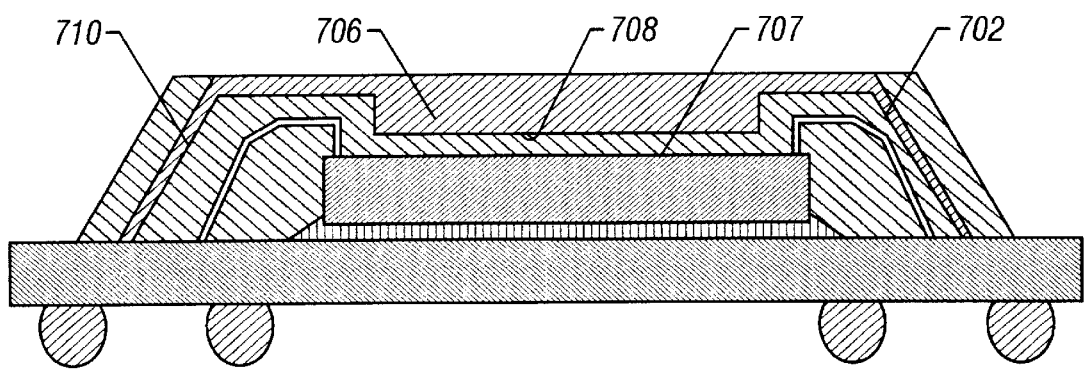
FIG. 6 is a diagrammatic sketch in a transverse sectional view thru an improved thermally enhanced plastic ball grid array package according to still another embodiment of the invention, showing a thicker center portion of the heat spreader and correspondingly thinner portion of the mold cap overlying the semiconductor device.

FIG. 6 shows yet another embodiment according to the invention, in which the heat spreader 702, 710 has been modified such that it is thicker in a mid portion 706 to minimize the length of the heat path between the die top 707 and heat spreader bottom 708, yet at the same time maintaining the desired package profile. Such thickening can be accomplished through the thickening of the metal in this area of the heat spreader or alternatively, through application of a thermally conductive material (as defined with reference to FIG. 5) in this region. Such a modification can significantly enhance thermal performance to 20% or more over conventional PBGA.

Other embodiments are within the following claims.

What is claimed is:

1. A plastic ball grid array semiconductor package, comprising a die attached on a substrate, and a metal heat spreader having supporting arms embedded in a molding cap, wherein any supporting arm that is affixed to the substrate is affixed using a resilient material.

2. The package of claim 1 wherein the resilient material has an elastic modulus in the range 0.5 MPa to 100 MPa.

3. The package of claim 1 wherein the resilient material comprises an elastomeric adhesive.

4. The package of claim 1 wherein the heat spreader is constructed of metal.

5. The package of claim 1 wherein the heat spreader has four supporting arms, configured so that their lower ends contact the substrate surface in a generally rectangular array.

6. The package of claim 5 herein the heat spreader has four supporting arms, configured so that their lower ends contact the substrate surface in a generally square array.

7. The package of claim 1 wherein a portion of the heat spreader lying overlying the semiconductor device protrudes downward toward the upper surface of the semiconductor device, and a corresponding portion of the mold cap is thinner between the upper surface of the semiconductor device and the heat spreader than more peripherally.

8. The package of claim 2 wherein the resilient material has an elastic modulus in the range 1 MPa to 10 MPa.

9. The package of claim 2 wherein the resilient material has an elastic modulus of 5.5 MPa.

10. The package of claim 3 wherein the elastomeric adhesive is a silicon adhesive.

11. A plastic ball grid array semiconductor package, comprising a die attached on a substrate, and a metal heat spreader having supporting arms embedded in a molding cap, wherein the embedded supporting arms are free of direct rigid affixation joining feet thereof to the substrate, and wherein an under surface of the metal heat spreader is chemically roughened at the interface of the heat spreader and the molding compound of the molding cap.

12. The package of claim 11 wherein the heat spreader is constructed of copper.

13. The package of claim 11 wherein the heat spreader has four supporting arms, configured so that their lower ends contact the substrate surface in a generally rectangular array.

14. The package of claim 13 wherein the heat spreader has four supporting arms, configured so that their lower ends contact the substrate surface in a generally square array.

15. The package of claim 11 wherein the roughened under surface of the heat spreader has a roughness in the range 0.5 um to 1.0 um.

16. The package of claim 15 wherein the roughened under surface of the heat spreader has a roughness of 0.5 um.

17. A plastic ball grid array semiconductor package, comprising a die attached on a substrate, and a metal heat spreader having supporting arms embedded in a molding cap, wherein the embedded supporting arms are free of direct rigid affixation joining feet thereof to the substrate, and wherein an under surface of the metal heat spreader comprises a black copper oxide layer at the interface of the heat spreader and the molding compound of the molding cap.

18. The package of claim 17 wherein the blackened copper oxide layer has a thickness in the range 3 um to 15 um.

19. The package of claim 18 wherein the blackened copper oxide layer has a thickness of 7 um.

20. A plastic ball grid array semiconductor package, comprising a die attached on a substrate, and a metal heat spreader having supporting arms embedded in a molding cap, wherein the embedded supporting arms are free of direct rigid affixation joining feet thereof to the substrate, and wherein the heat spreader is constructed of copper.

21. A plastic ball grid array semiconductor package, comprising a die attached on a substrate, and a metal heat spreader having supporting arms embedded in a molding cap, wherein the embedded supporting arms are free of direct rigid affixation joining feet thereof to the substrate, and wherein a portion of the heat spreader lying overlying the semiconductor device protrudes downward toward the upper surface of the semiconductor device, and a corresponding portion of the mold cap is thinner between the upper surface of the semiconductor device and the heat spreader than more peripherally.

* * * * *